US012724048B2

(12) United States Patent
Kulik

(10) Patent No.: US 12,724,048 B2
(45) Date of Patent: Sep. 1, 2026

(54) WIRE TESTING METHOD AND DEVICE

(71) Applicant: WIRE TESTER, LLC, Murray, UT (US)

(72) Inventor: Andrzej Kulik, Murray, UT (US)

(73) Assignee: Andrzej Kulik, Murray, UT (US)

( * ) Notice: Subject to any disclaimer, the term of this patent is extended or adjusted under 35 U.S.C. 154(b) by 214 days.

(21) Appl. No.: 18/420,589

(22) Filed: Jan. 23, 2024

(65) Prior Publication Data

US 2024/0248123 A1 Jul. 25, 2024

Related U.S. Application Data

(60) Provisional application No. 63/540,226, filed on Sep. 25, 2023, provisional application No. 63/440,850, filed on Jan. 24, 2023.

(51) Int. Cl.

| | |
|---|---|
| ***G01R 27/02*** | (2006.01) |
| ***F24D 13/02*** | (2006.01) |
| ***H05B 1/02*** | (2006.01) |

(52) U.S. Cl.

CPC ............ *G01R 27/02* (2013.01); *F24D 13/024* (2013.01); *H05B 1/0277* (2013.01)

(58) Field of Classification Search

CPC ......... G01R 27/00; G01R 27/02; F24D 13/00; F24D 13/02; F24D 13/022; F24D 13/024; H05B 1/00; H05B 1/02; H05B 1/0227; H05B 1/0252; H05B 1/0275; H05B 1/0277

USPC ........................................ 324/600, 649, 691

See application file for complete search history.

(56) References Cited

U.S. PATENT DOCUMENTS

| | | | | |
|---|---|---|---|---|
| 6,300,598 | B1 * | 10/2001 | Chiles | H05B 1/0277 219/545 |
| 2006/0192566 | A1 * | 8/2006 | Fleming | G01R 31/52 324/555 |
| 2025/0067818 | A1 * | 2/2025 | Barnes | G01R 27/02 |

FOREIGN PATENT DOCUMENTS

| | | | | |
|---|---|---|---|---|
| CN | 104749455 A | * | 7/2015 | G01R 31/00 |
| CN | 208283538 U | * | 12/2018 | G01R 35/00 |
| CN | 112098899 A | * | 12/2020 | G01R 31/54 |
| CN | 213398688 U | * | 6/2021 | G01R 27/20 |
| CN | 217060349 U | * | 7/2022 | G01R 27/20 |
| CN | 116164918 A | * | 5/2023 | G01M 7/025 |
| CN | 218995518 U | * | 5/2023 | G01R 27/20 |
| CN | 116736186 A | * | 9/2023 | G01R 31/54 |

* cited by examiner

*Primary Examiner* — Hoai-An D. Nguyen

(74) *Attorney, Agent, or Firm* — Travis Banta; Ascent IP Law

(57) ABSTRACT

Disclosed herein is a wire testing device that includes a body. The body includes a display screen, a speaker, lights, and one or more wire ports. The display screen includes a resistance indicator and one more ground test indicators. The one or more wire ports may connect to a temperature sensor, a resistance detector, a personal electronic device or other devices. The wire testing device may further be implemented as part of a thermostat for controlling an in-floor heating element.

20 Claims, 6 Drawing Sheets

Figure 2:
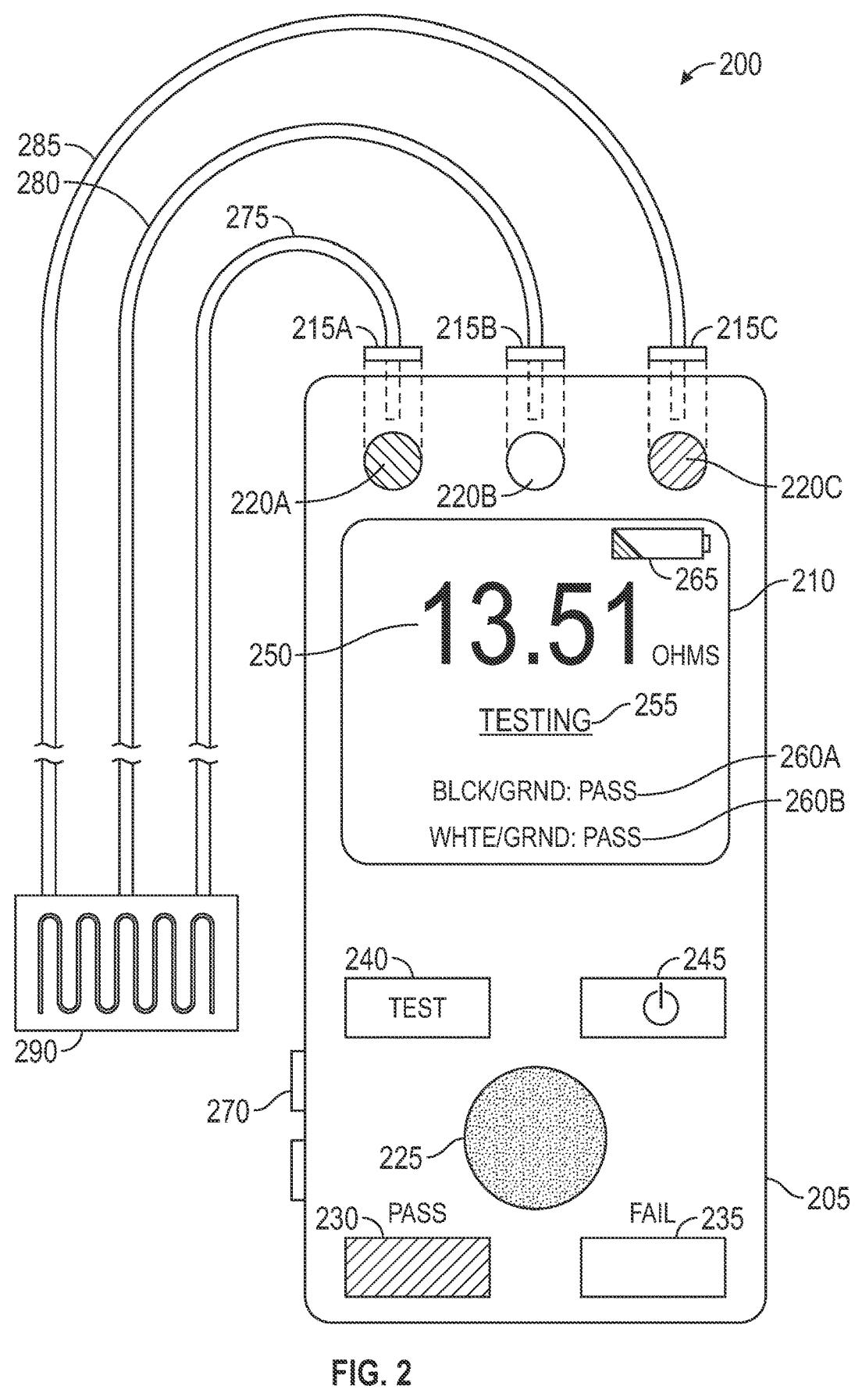

200
285
280
275
215A
215B
215C
220A
220B
220C
13.51 OHMS
265
210
250
TESTING
255
BLCK/GRND: PASS
260A
WHTE/GRND: PASS
260B
240
TEST
245
290
270
225
205
230 PASS
FAIL 235

WIRE TESTING METHOD AND DEVICE

PRIORITY CLAIM

This application claims the priority of and benefit to U.S. Provisional Patent Application No. 63/440,850 filed on Jan. 24, 2023 and U.S. Provisional Application No. 63/540,226 filed on Sep. 25, 2023. These applications are hereby incorporated by reference.

TECHNICAL FIELD

This disclosure relates generally to a wire testing method and device.

BACKGROUND

Anciently the Chinese and the Koreans were the first to heat their floor using ducts connected to a wood stove that was installed under a house. A similar technology was later implemented by the Romans. The Roman heating system was commonly used in public baths. The Roman system used a furnace to direct heated air under the floor and through the walls using pipes.

An electric radiant floor heating system was first invented in the United States in the early 1900s. This early system used electrical resistance in a wire installed in a floor to generate heat, which was then conducted through metal or concrete to heat the floor surface. The weakness was the system was difficult to install and repair and was only moderately successful in applying heat to a floor.

Advances in technology in the 1980s led to the development of thin, flexible electric radiant floor heating systems. These systems use thin, flexible heating elements that could be easily installed under a variety of flooring materials, including tile, stone, and wood. Today, radiant floor heating systems are commonly used in a wide range of buildings, including homes, offices, and commercial spaces. They are popular for their ability to provide consistent, even heat and for their energy efficiency. There are many different types of radiant floor heating systems available, each with its own set of features and benefits.

Flexible electric radiant floor heating systems use thin, flexible heating elements that can be easily installed. These heating elements are typically made of a conductive material, such as carbon fiber or copper, and are sandwiched between layers of insulation and a protective covering. The heating elements are connected to a power source and a thermostat, which is used to control the temperature of the floor.

When the thermostat senses that the room temperature has dropped below the desired level, the thermostat sends a signal to the heating elements to turn on. The heating elements then generate heat, which is conducted through the flooring material to warm the room. Because the heat is generated directly in the floor, radiant floor heating systems can provide consistently even heat throughout a room.

The downside is electric radiant heating is difficult to repair because the elements are often placed into cement under tile, stone, or wood. Accordingly, radiant floor heating installers must use extra care during installation to ensure installation has been done without damage to the radiant heating system. During installation, the wires are most vulnerable and subject to damage. Damage can affect the longevity and warranty of the heating system. Testing the connectivity of the elements is advisable before, during, and after installation though few options exist for element testing devices and those that do exist are generally difficult to use and are inconsistent in providing accurate results.

There are two main types of radiant heat element testing equipment: a fail-safe meter and a multimeter or ohm meter. The fail-safe meter attaches to the wires during installation and triggers an alarm when an element is disconnected. The downside is the alarm only actuates when there is a detection of a large change in the electrical resistance of a wire in the radiant heat element. Smaller changes in resistance are undetected, thereby damage to the radiant heating apparatus goes undetected. A multimeter or an ohm meter can measure minor changes in resistance. A multimeter or an ohm meter is however difficult to use due to complexity, cannot be calibrated to the resistance value of the radiant heat element, does not have an audible or visual alarm to indicate a change in resistance, and the test probes that are often found on multimeters and ohm meters are difficult to use with electric radiant heating wires which create difficulty in obtaining an accurate reading.

SUMMARY

This disclosure relates generally to a wire testing method and device.

BRIEF DESCRIPTION OF THE DRAWINGS

Non-limiting and non-exhaustive implementations of the present disclosure are described with reference to the following figures, wherein similar or like reference numerals refer to similar or like parts throughout the various views unless otherwise specified. The advantages of the present disclosure will become better understood with regard to the following description and accompanying drawings:

FIG. 2 illustrates a front view of an exemplary implementation of a wire testing device.

FIG. 3 illustrates a front view of an active exemplary implementation of a wire testing device.

FIG. 6 illustrates a thermostat device which incorporates a wire testing device.

DETAILED DESCRIPTION

In the following description, for purposes of explanation and not limitation, specific techniques and embodiments are set forth, such as particular techniques and configurations, in order to provide a thorough understanding of the device disclosed herein. While the techniques and embodiments will primarily be described in context with the accompanying drawings, those skilled in the art will further appreciate that the techniques and embodiments may also be practiced in other similar methods.

Reference will now be made in detail to the exemplary embodiments, examples of which are illustrated in the accompanying drawings. Wherever possible, the same or similar reference numbers are used throughout the drawings to refer to the same or similar parts. It is further noted that elements disclosed with respect to particular embodiments are not restricted to only those embodiments in which they are described. For example, an element described in reference to one embodiment or figure may be alternatively included in another embodiment or figure regardless of whether or not those elements are shown or described in another embodiment or figure. In other words, elements in the figures may be interchangeable between various embodiments disclosed herein, whether shown or not.

Other embodiments will be apparent to those skilled in the art from consideration of the specification and practice of the disclosure disclosed herein. It is intended that the specification and examples be considered exemplary only, with a true scope and spirit of the invention being indicated by the recited claims.

Figure 1:
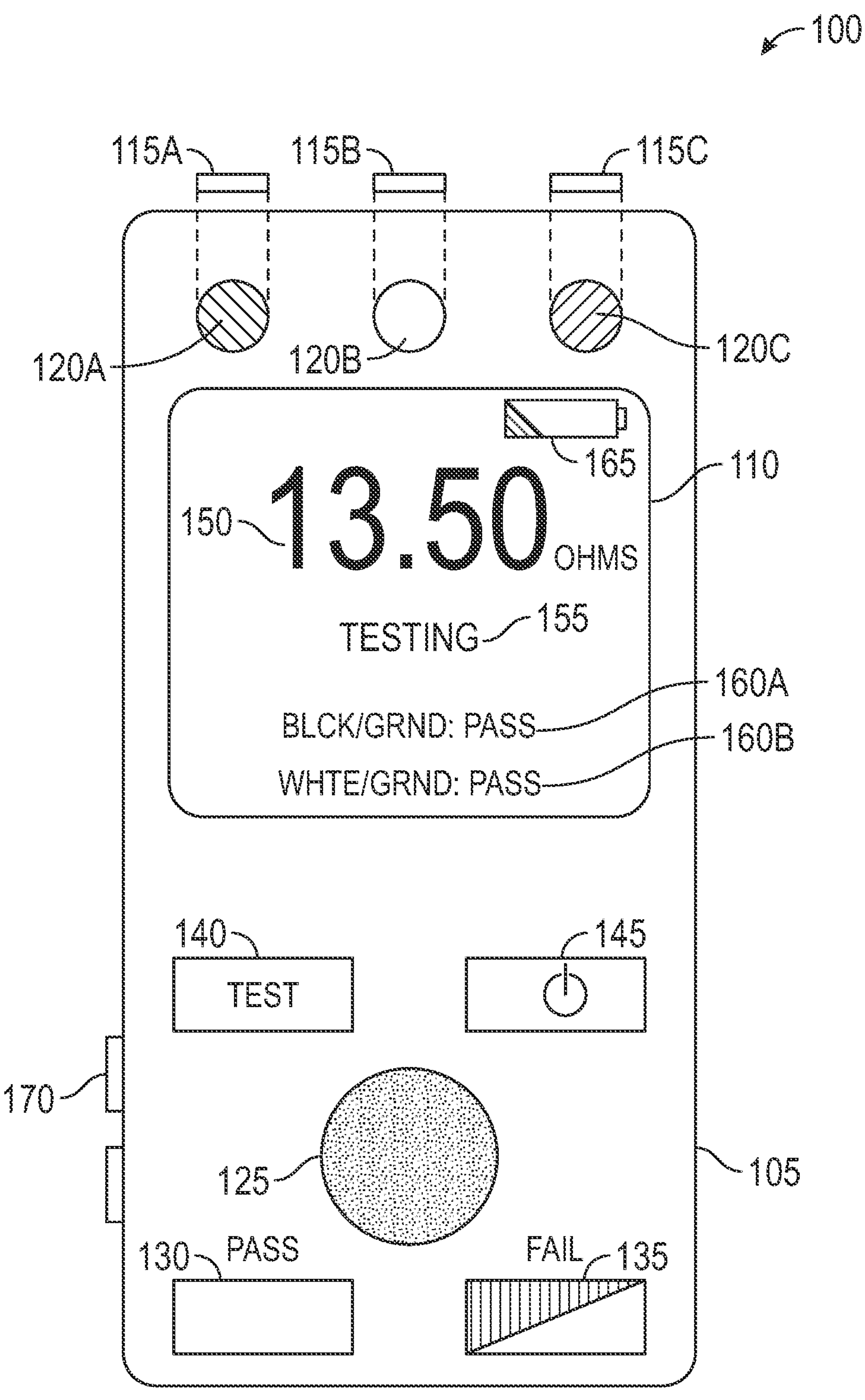
FIG. 1 illustrates a front view of an exemplary implementation of a wire testing device.

FIG. 1 illustrates a top view of an exemplary implementation of wire testing device 100. Wire testing device 100 may be powered by batteries that may be rechargeable and include a processor, which causes wire testing device 100 to perform various operations that will be described herein. The processor may incorporate or interact with one or other discrete circuit elements to create a wireless information connection between wire testing device 100 and a personal electronic device, as will be discussed below. Alternatively, wire testing device 100 may connect to power using a standard electrical plug known in the art. Wire testing device 100 may be turned on and off by on/off button 145. Wire testing device 100 may include body 105 which may be made of plastic or other insulative material known in the art. Body 105 may include wire ports 115A-C. Wire port 115A may be designated for a "hot" wire which is often red or black (e.g, a wire that carries the electrical current). Wire port 115A may include release button 120A. Release button 120A may be colored red or black or may have other tactile or visual indicators to denote where the hot wire may connect. Wire port 115B may be designated for a neutral wire which is often white. Wire port 115B may include release button 120B. Release button 120B may be colored white or may have other tactile or visual indicators to denote where the neutral wire may connect. Wire port 115C may be designated for a ground wire which is often green, or green with a yellow stripe, or silver. Wire port 115C may include a release button 120C. Release button 120C may be colored green, or green with yellow, or silver, or may have other tactile or visual indicators to denote where the ground wire may connect.

Connecting wires to wire testing device 100 may be done by pressing down their corresponding wire release buttons 120A-C and inserting each wire individually into their corresponding wire ports 115A-C and releasing the wire release buttons 120A-C to secure the wires in place. Once hot, neutral, and ground wires are attached a user may select test button 140 to calibrate and commence testing the three wires inserted into wire ports 115A-C. Once in operation, the results may be displayed using various indicators such as visual indicators. For example, pass indicator 130 may light up when a resistance test is passed. Similarly, fail indicator 135 may light up with a failed resistance test. Furthermore, speaker 125 may sound, upon completion of a test to indicate one or more actions such as a test has begun, a test in progress, a test completion, a passed test result, a failed test result, a wireless connection, and an error. Each sound emitted by speaker 125 may be different to distinguish each action by using a different volume, melody, tone, rhythm, style, etc. For example, a single chime may sound upon completion of the test followed by an alarm to indicate a failed test result. Further a buzzer may sound if an error occurs, and a sweet melody may be sounded for a passed test result. The sound emitted by speaker 125 may be adjustable using volume buttons 170. Other indicators may be found on display screen 110.

Display screen 110 may a touch responsive display device and include a resistance indicator 150, operation indicator 155, ground test indicators 160A-B, and battery life indicator 165. A volume indicator, wireless connection, and other indicators may also be included on display screen 110. The resistance indicator 150 may display the resistance in ohms. An initial reading may be used to calibrate the device. When there is at least a 10% deviation in ohms an audible alarm may be sounded through speaker 125 and visual fail indicator 135 may be actuated and the resistance in ohms may be displayed. Ground test indicators 160A-B may further indicate a failure. Alternatively, if a test was passed and the resistance stayed within 10% pass indicator 130 may actuate, resistance indicator 150 may display the resistance and ground test indicators 160A-B may display a pass, and speaker 125 may omit a sound. Alternatively, the ohms reading sensitivity range may be adjusted to be 5 percent or another tolerance of a user's choice or setting.

FIG. 2 illustrates a top view of an active exemplary implementation of wire testing device 200. Wire testing device 200 may be powered by batteries that may be rechargeable. Alternatively, wire testing device 200 may connect to power using a plug. Wire testing device 200 may be turned on and off by on/off button 245. Wire testing device 200 may include body 205 which may be made of plastic or other insulative material known in the art. Body 205 may include wire ports 215A-C. Wire port 215A may be designated for hot wire 275 which is often red or black. Wire port 215A may include release button 220A. Release button 220A may be colored red or black or may have other tactile or visual indicators to denote where hot wire 275 may connect. Wire port 215B may be designated for a neutral wire 280 which is often white. Wire port 215B may include release button 220B. Release button 220B may be colored white or may have other tactile or visual indicators to denote where neutral wire 280 may connect. Wire port 215C may be designated for ground wire 285 which is often green, or green with a yellow stripe, or silver. Wire port 215C may include release button 220C. Release button 220C may be colored green, or green with yellow, or silver or may have other tactile or visual indicators to denote where ground wire 285 may connect. Hot wire 275, neutral wire 280, and ground wire 285 may be connected to an electric radiant heating system 290.

Connecting wires to wire testing device 200 may be done by pressing down their corresponding wire release buttons 220A-C and inserting each wire individually inserted into their corresponding wire port 215A-C and releasing the wire release buttons 220A-C to secure wires in place. Once hot wire 275, neutral wire 280, and ground wire 285 are connected to wire ports 215A-C a user may select test button 240 to calibrate and test. Once a test operation has been completed the results may be displayed using various indicators on display screen 210. Display screen 210 may display a resistance indicator 250 (e.g., 13.51 ohms), operation indicator 255 (e.g., testing, fail found), ground test indicators 260A-B (e.g., pass, fail), and battery life indicator 265. A volume indicator, wireless connection, and other indicators may also be included on display screen 210. For example, if device 200 is designed to wirelessly communicate with other devices, when in operation, this capability may be displayed on display screen 210. The resistance indicator 250 may display the resistance in ohms upon completion of a test. Moreover, pass indicator 230 may light up when a resistance test is passed. Similarly, fail indicator 235 may light up with a failed resistance test.

Furthermore, speaker 225 may sound, upon completion of a test to indicate one or more actions such as a test has begun, a test in progress, a test completion, a passed test result, a failed test result, a wireless connection, and an error. Each sound emitted by speaker 225 may be different to distinguish each action by using a different volume, melody, tone, rhythm, style, etc. For example, a single chime may sound upon completion of the test followed by an alarm to indicate a failed test result. Further a buzzer may sound if an error occurs, and a sweet melody may be sounded for a passed test result. The sound emitted by speaker 225 may be adjustable using volume buttons 270. Other indicators may be found on display screen 210.

An initial reading may be used to calibrate the device. When there is at least a 10% deviation in ohms, from the calibrated value, an audible alarm may be sounded through speaker 225 and visual fail indicator 235 may be actuated and the resistance in ohms may be displayed. Ground test indicators 260A-B may further indicate a failure. Alternatively, if a test was passed and the resistance stayed within 10% pass indicator 230 may actuate, resistance indicator 250 may display the resistance, ground test indicators 260A-B may display a pass, and speaker 225 may omit a sound. Alternatively, the ohms reading deviation range may be adjusted to be 5 −15% or to another setting chosen by a user.

Figure 3:
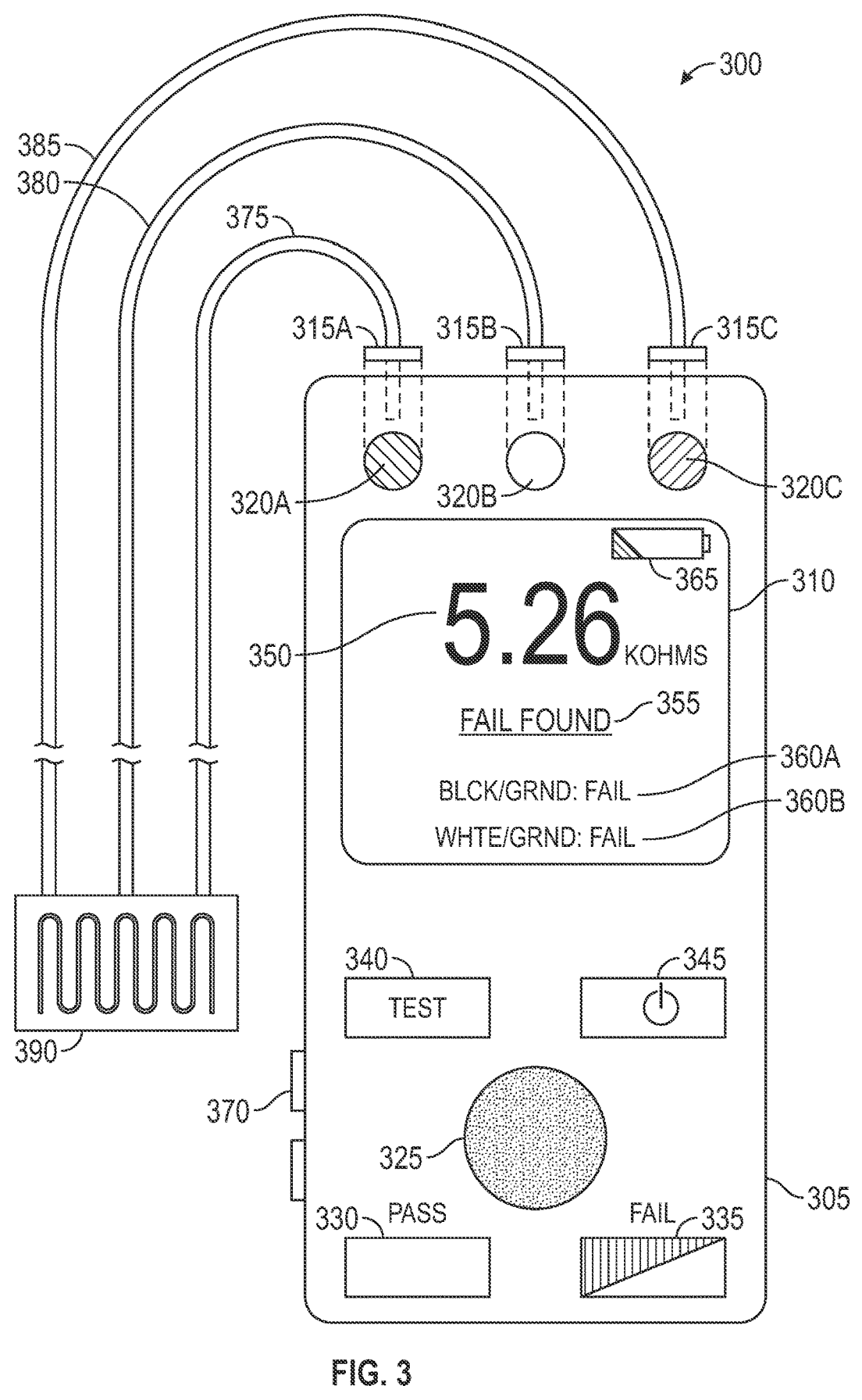

FIG. 3 illustrates a top view of an active exemplary implementation of wire testing device 300. Wire testing device 300 may be powered by batteries that may be rechargeable. Alternatively, wire testing device 300 may connect to power using a plug. Wire testing device 300 may be turned on and off by on/off button 345. Wire testing device 300 may include body 305 which may be made of plastic or other insulative material known in the art. Body 305 may include wire ports 315A-C attached to the side of body 305.

Wire port 315A may be designated for hot wire 375 which is often red or black. Wire port 315A may include release button 320A. Release button 320A may be colored red or black or may have other tactile or visual indicators to denote where hot wire 375 may connect. Wire port 315B may be designated for a neutral wire 380 which is often white. Wire port 315B may include release button 320B. Release button 320B may be colored white or may have other tactile or visual indicators to denote where neutral wire 380 may connect. Wire port 315C may be designated for ground wire 385 which is often green, or green with a yellow stripe, or silver. Wire port 315C may include release button 320C. Release button 320C may be colored green, or green with yellow, or silver, or may have other tactile or visual indicators to denote where ground wire 385 may connect. Hot wire 375, neutral wire 380, and ground wire 385 may be connected to an electric radiant heating system 390 for testing.

Connecting wires to wire testing device 300 may be done by pressing down their corresponding wire release buttons 320A-C and inserting each wire individually inserted into their corresponding wire port 315A-C and releasing wire release buttons 320A-C in order to lock the wires into a state where they are connected to wire testing device 300. Once hot wire 375, neutral wire 380, and ground wire 385 are connected to wire ports 315A-C a user may select test button 340 to calibrate and test. Once in operation, the results may be displayed using various indicators on display screen 310. Display screen 310 may display a resistance indicator 350 (e.g., 5.26 kilohms), operation indicator 355 (e.g., testing, fail found), ground test indicators 360A-B (e.g., fail, pass), and battery life indicator 365. A volume indicator, wireless connection, and other indicators may also be included on display screen 310. For example, if device 300 is designed to wirelessly communicate with other devices, when in operation, this capability may be displayed on display screen 310. The resistance indicator 350 may display the resistance in ohms upon completion of a test. Moreover, pass indicator 330 may light up when a resistance test is passed (as depicted in FIG. 2). Similarly, fail indicator 335 may light up with a failed resistance test.

Furthermore, speaker 325 may sound, upon completion of a test to indicate one or more actions such as a test has begun, a test in progress, a test completion, a passed test result, a failed test result, a wireless connection, and an error. Each sound emitted by speaker 325 may be different to distinguish each action by using a different volume, melody, tone, rhythm, style, etc. For example, a single chime may sound upon completion of the test followed by an alarm to indicate a failed test result. Further a buzzer may sound if an error occurs, and a sweet melody may be sounded for a passed test result. The sound emitted by speaker 325 may be adjustable using volume buttons 370. Other indicators may be found on display screen 310.

An initial reading may be used to calibrate the device. When there is at least a 10% deviation in ohms, from the calibrated value, an audible alarm may be sounded through speaker 325 and visual fail indicator 335 may be actuated and the resistance in ohms may be displayed. Ground test indicators 360A-B may further indicate a failure. Alternatively, if a test was passed and the resistance stays within 10% of the calibrated value, pass indicator 330 may actuate, resistance indicator 350 may display the resistance, ground test indicators 360A-B may display a pass, and speaker 325 may omit or emit a sound. Alternatively, the ohms reading deviation range may be adjusted to be between 5 and 15%.

Figure 4:
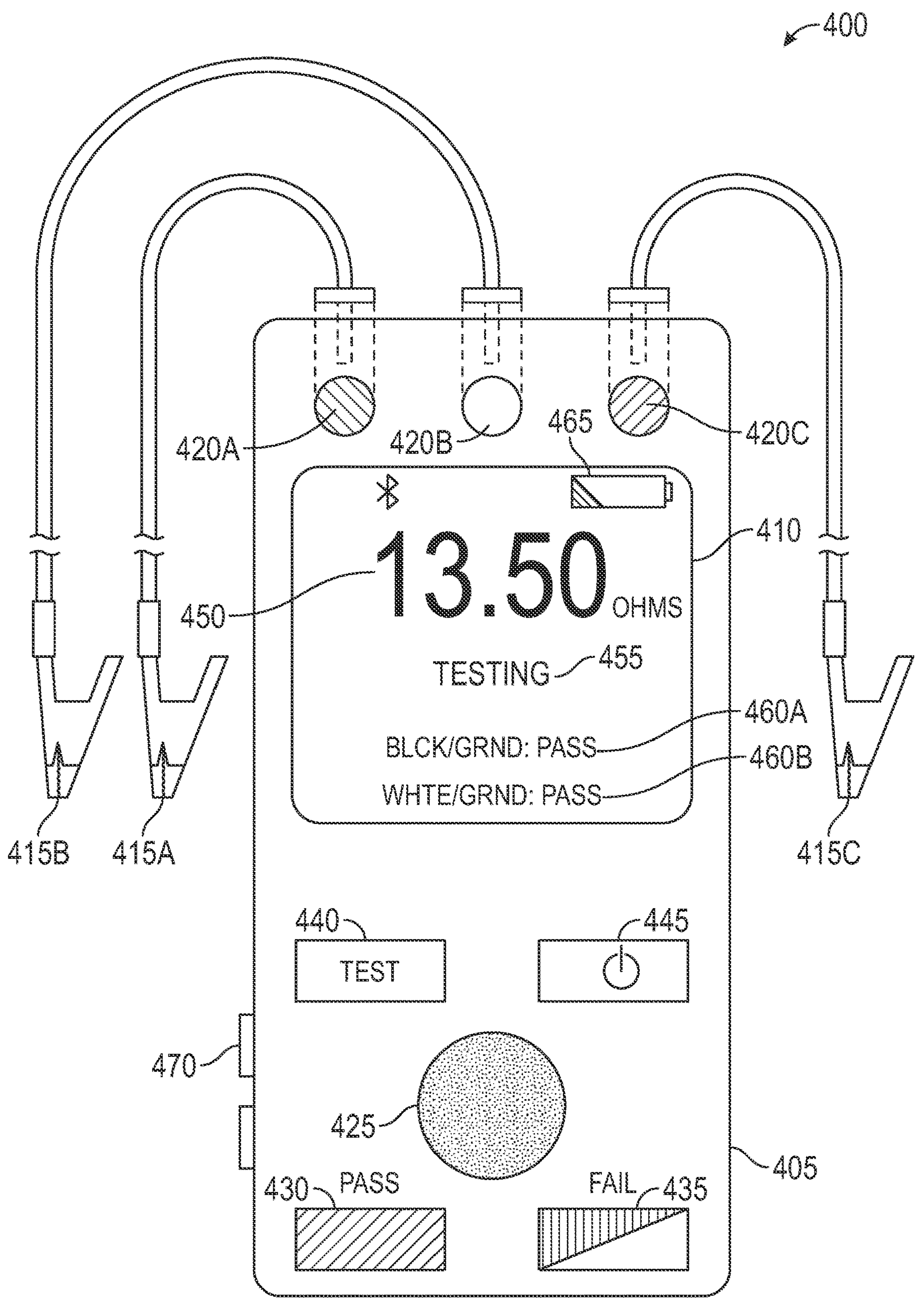
FIG. 4 illustrates a front view of an active exemplary implementation of a wire testing device.

FIG. 4 illustrates a top view of an exemplary implementation of wire testing device 400. Wire testing device 400 may be powered by batteries that may be rechargeable. Alternatively, wire testing device 400 may connect to power using a plug.

Wire testing device 400 may be turned on and off by on/off button 445. Wire testing device 400 may include body 405 which may be made of plastic or other insulative material known in the art. Body 405 may include wire clips 415A-C. Wire clip 415A may be designated for a hot wire which is often red or black and may be presented with similar colors. Wire clip 415A may include indicator 420A to indicate what wire is to be attached to wire clip 415A. Indicator 420A may be colored red or black or may have other tactile or visual indicators to denote where the hot wire may attach. Indicator 420A may include a light that lights up when attached to a designated wire. Wire clip 415B may be designated for a neutral wire which is often white. Accordingly, wire clip 415B may be the same color and may include the corresponding indicator 420B.

Indicator 420B may be colored white or may have other tactile or visual indicators to denote where the neutral wire may attach. Indicator 420B may include a light that lights up when attached to a designated wire. Wire clip 415C may be designated for a ground wire which is often green, or green with a yellow stripe, or silver. Accordingly, wire clip 415C may be the same color and may include the corresponding indicator 420C. Indicator 420C may be colored green, or green with yellow, or silver or may have other tactile or visual indicators to denote where the ground wire may attach. Indicator 420C may include a light that lights up when attached to a designated wire.

Attaching wires to wire testing device 400 may be done by clipping each wire individually to their corresponding wire clip 415A-C. Once neutral, hot, and ground wires are attached a user may select test button 440 to calibrate and test. Once in operation, the calibration value may be displayed on resistance indicator 450 on display screen 410. During various operations, pass indicator 430 may light up when a resistance test is passed. Similarly, fail indicator 435 may light up with a failed resistance test.

Furthermore, speaker 425 may sound, upon completion of a test to indicate one or more actions such as a test has begun, a test in progress, a test completion, a passed test result, a failed test result, a wireless connection, and an error. Each sound emitted by speaker 425 may be different to distinguish each action by using a different volume, melody, tone, rhythm, style, etc. For example, a single chime may sound upon completion of the test followed by an alarm to indicate a failed test result. Further a buzzer may sound if an error occurs, and a sweet melody may be sounded for a passed test result. The sound emitted by speaker 425 may be adjustable using volume buttons 470. Other indicators may be found on display screen 410. For example, if device 400 is designed to wirelessly communicate with other devices, when in operation, this capability may be displayed on display screen 410. The resistance indicator 450 may display the resistance in ohms upon completion of a test.

Display screen 410 may display a resistance indicator 450, operation indicator 455, ground test indicators 460A-B, and battery life indicator 465. A volume indicator, wireless connection, and other indicators may also be included on display screen 410. The resistance indicator 450 may display the resistance in ohms. An initial reading may be used to calibrate the device. When there is at least a 10% deviation in ohms, from the calibrated value, an audible alarm may sound through speaker 425 and visual fail indicator 435 may be actuated and the resistance in ohms may be displayed. Ground test indicators 460A-B may further indicate a failure. Alternatively, if a test was passed and the resistance stayed within 10% of the calibration value, pass indicator 430 may actuate, resistance indicator 450 may display the resistance, ground test indicators 460A-B may display a pass, and speaker 425 may omit or emit a sound. Alternatively, the ohms reading deviation range may be adjusted to be between 5 and 15% or may be set by a user according to the user's preferences.

Figure 5:
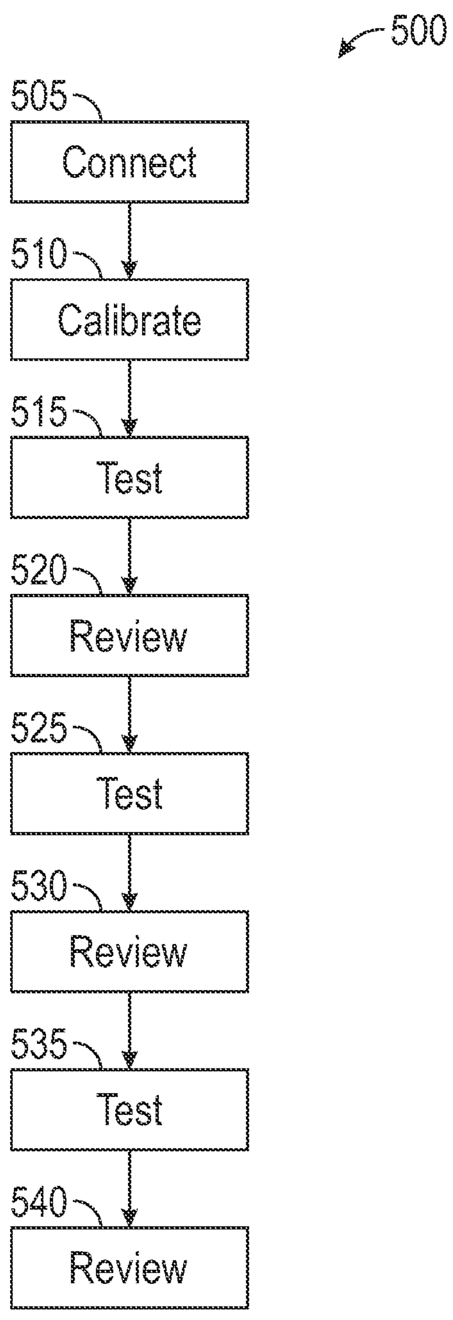
FIG. 5 illustrates a flow chart of an exemplary method for operating that wire testing device.

FIG. 5 illustrates a flow chart of exemplary method 500 for operating wire testing device 200. Wire testing devices 100, 300, and 400 found in FIGS. 1, 3, and 4 may be used in a similar matter. However, elements from FIG. 2 will mainly be used as an example for clarity but similar elements in FIGS. 1, 3, and 4 may be used in a similar manner. Step 505 may take place before the installation of an exemplary radiant floor heating system when the radiant heating system (or whatever system is being tested) is connected to power. Connecting wires from system 290 to wire testing device 200 takes place in step 505. The type of connection, depicted in FIG. 2 may be actuated by pushing down one of release buttons 220A-C while inserting the appropriate wire 275, 280, or 285 into one of the corresponding wire ports 215A-C. Once one of wires 275, 280, or 285 is disposed within one of ports 215A-C buttons 220A-C may be released connecting one of wires 275, 280, or 285 to ports 220A-C.

Release buttons 220A-C and/or ports 215A-C may be color coded to indicate what one of wires 275, 280, or 285 is designated for one of ports 215A-C. Other visual indicators or textures may be disposed on housing 205. Connection in step 505 may also be accomplished using wire clips 415A-C and indicators 420A-C may be included to designate which one of wire clips 415A-C should connect with which of wires 275, 280, or 285. Further clips 415A-C or the wires connected to clips 415A-C may be a certain color. Other visual indicators or textures may be disposed on housing 405.

Once wires 275, 280, and 285 have been connected to wire tester 200 in step 505 the system may be calibrated in step 510. Calibration in step 510 will provide a resistance value depicted on display screen 210 as resistance indicator 250. Under step 510 calibrated value may be displayed on resistance indicator 250 and may be used as a baseline to compare to other tests that may be run in the future. Deviation amounts from the calibrated value determined in step 510 may be used to set off an alarm, or other sound indication through speaker 225 and/or visually through pass/fail indicators 230 or 235. Additionally, during step 510 calibrating, a sound may be emitted and a numerical indication may be displayed as an operation indicator 255 on display screen 210.

Once calibrated in step 510 test 515 may be run before, during, and after the installation process. This may be done by pressing test button 240. When test button 240 is pressed, testing will be indicated in operation indicator 255 and a resistance value will be depicted as resistance indicator 250 and a sound may be emitted. Further, ground test indicators 260A-B will indicate pass or fail depending on the outcome of the test. Further, pass indicator 230 or fail indicator 235 may light up depending on the deviation of the resistance value from the calibrated value. For example, if the resistance value deviates from the calibrated value by more than 10% a failure may be indicated on display screen 210, fail indicator 235 and an alarm sounded through speaker 225. Deviation value may be adjusted between 5-15% or another threshold set by the user according to the user's preferences.

Once results are displayed on wire testing device 200 the results may be reviewed under step 520. Reviewing under step 520 may include displaying information displayed on wire testing device 200. This includes displaying a value on the resistance indicator 250, the operation indicator 255, the ground test indicators 260A-B, and the pass and fail indicators 230 and 235. If fail indicator 235 and/or an alarm, or other sound is being emitted from speaker 225 the review may cause a sound indicator or a visual indicator that indicates that a user should check the wires to make sure all electrical connections are connected appropriately. Once the review is complete the installation process may begin.

Step 525 may take place during installation. Step 525 may take place at the halfway point or may take place multiple times during the installation process. This test in step 525 is advantageous to see if any damage has occurred during the installation. In step 525 a test may be run by pressing test button 240. When test button 240 is pressed testing will be indicated in operation indicator 255 and a resistance value may be depicted as resistance indicator 250. Further, ground test indicators 260A-B may indicate pass or fail depending on the outcome of the test. Further, pass indicator 230 or fail indicator 235 may light up depending on the deviation of the resistance value from the calibrated value. For example, if the resistance value deviates from the calibrated value by more than 10% a failure may be indicated on display screen 210, fail indicator 235, and an alarm or other sound is sounded through speaker 225. Deviation percentage may be adjusted between 5-15% of the calibrated value or based upon a threshold set by a user according to user preferences.

After step 525 has been completed the results may be displayed on wire testing device 200. Reviewing under step 530 includes displaying a value on the resistance indicator 250, the operation indicator 255, the ground test indicators 260A-B, and the pass and fail indicators 230 and 235. If the fail indicator 235 is flashing or lit up and/or an alarm is being sounded in speaker 225 a user may review the work completed since the last test was run to see where damage to the system occurred. Once the situation is rectified, a user may be free to continue the installation process.

Upon completion of the installation of system 290, another test may be run under step 535. This final step is to ensure that everything within the system is running as it should. In step 535 a test may be run by pressing test button 240. When test button 240 is pressed testing will be indicated in operation indicator 255 and a resistance value may be depicted as resistance indicator 250. Further, ground test indicators 260A-B may indicate pass or fail depending on the outcome of the test. Further, pass indicator 230 or fail indicator 235 may light up depending on the deviation of the resistance value from the calibrated value. For example, if the resistance value deviates from the calibrated value by more than 10% a failure may be indicated on display screen 210, fail indicator 235, and an alarm, or another sound, is sounded through speaker 225. The deviation from the calibrated value may be adjustable to be between 5 and 15% or to another threshold set by the user according to the user's preferences.

In step 540 the results may be displayed for review one last time. Reviewing under step 520 may include displaying a value of the resistance indicator 250, the operation indicator 255, the ground test indicators 260A-B, and the pass and fail indicators 230 and 235. If fail indicator 235 is lit or flashing and or an alarm, or another sound, is being sounded in speaker 225 a user may review the work completed since the last test was run to determine where damage to the system occurred. Once the situation is rectified, a user may be free to finish up the installation process and to test a final time to make sure everything is as it should be.

In an alternative method, after calibration 510 wire testing device 200, wire testing device 200 may continuously perform tests and display readouts in real time allowing a user to see an indication of a failure in the event damage has been done to the system. The continual read-out will also show a change in the resistance value as displayed on display screen 210. In this manner, a review of display steps 520, 530, and 540 may be ongoing until the project is completed.

Figure 6:
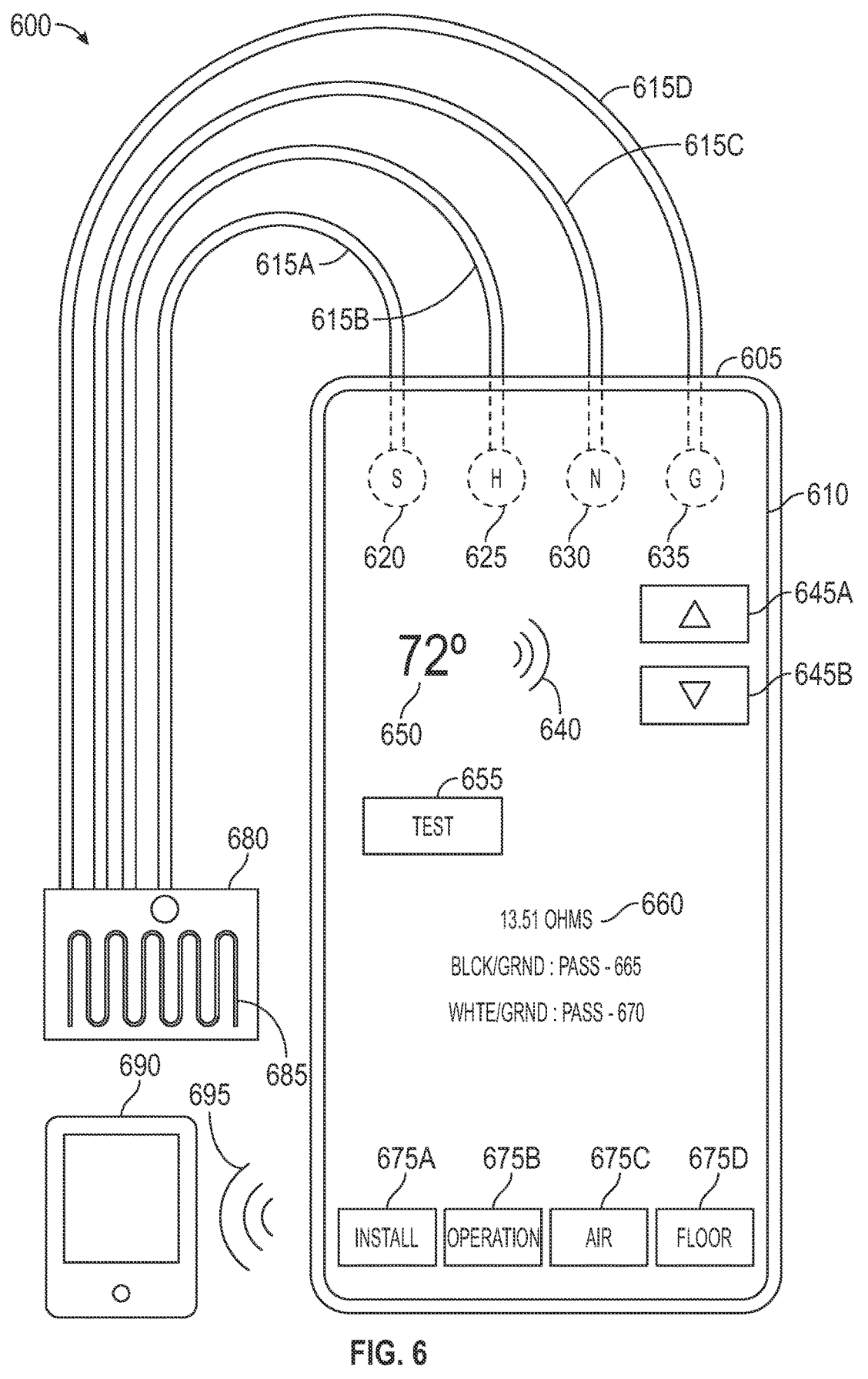

FIG. 6 illustrates a thermostat 600 which incorporates a wire testing device, such as device 100, shown in FIG. 1. Thermostat 600 may be a thermostat which controls a heating and cooling system in a house or may be a thermostat that controls a floor heating system, or both. As shown in FIG. 6, thermostat 600 includes a body 605 and a screen 610. Screen 610 may be installed within body 605 which connects thermostat 600 to a wall such that screen 610 is mounted on a wall for interaction with a user. Screen 610 may provide touch screen capabilities or, alternatively, thermostat 600 may provide mechanical or mechanical/electrical buttons which allow a user to interact with thermostat 600. For purposes of discussion in this disclosure, it is assumed that thermostat screen 610 is a touch screen.

Thermostat 600 provides for connecting wires 615A, 615B, 615C, and 615D to thermostat 600. For example, thermostat 600 may provide a sensor connection 620 which receives sensor data from sensor 680, as will be discussed below. Thermostat 600 may further provide for electrical connections, such as electrical connectors 625, 630, and 635. In one example, electrical connector 625 may operate as a hot wire (positive voltage) connection, electrical connector 630 may operate as a neutral wire (a current return) connection, while electrical connection 635 may be a ground connection. Alternatively, wire connections 625-635 may also operate using direct current from a battery to provide power to thermostat 600 but may still receive current, voltage, and resistance information from an in floor heating system, through wire connections 625-635, such as heating system 685, which will be discussed below. Wire connections 625-635 may be implemented by thermostat 600 on any side, but is illustrated as being connected to the back of thermostat 600. Other connectors may also be connected through wire connections 620-635, which are not limited to the wire connections shown and discussed above. For example, one or more of wire connections 620-635 may connect to an external temperature sensor or an ambient temperature sensor. The external ambient temperature sensor may detect a heating condition of an in-floor heating system to determine if the in-floor heating system is warming or maintaining temperature either at a particular moment in time or across some duration of time. Receiving a test result from the external ambient temperature sensor that indicates temperature sensor temperature and the ambient room temperature are approximately the same (e.g., within 10% of the same temperature value) indicates that the temperature sensor is working properly.

Screen 610 may provide the user with various information. For example, in a normal operating mode, screen 610 may provide temperature information 650, which may be representative of a temperature of air surrounding thermostat 600 or may be representative of a temperature of a floor, or both, as desired. As shown in FIG. 6, temperature information 650 indicates that the measured current temperature is 72 degrees. A user may interact with screen 610 to increase or decrease the temperature with temperature increase button 645A or temperature decrease button 645B. Screen 610 may further provide an indicator 640 which shows that thermostat 610 is connected wirelessly to another device such as a network router or to a mobile device directly, as will be further discussed below.

As shown in FIG. 6, a test button 655 is provided on screen 610 which allows a user to test a heating circuit installed within a floor, such as a tile floor, as discussed herein. Test button 655 may cause thermostat 600 to execute a test to determine a resistance of, for example, heating system 685. Thermostat 600 may detect a resistance based on any method known in the art, including detecting a voltage or current to calculate a resistance using Ohm's law. Once the resistance value is detected, thermostat 600 may provide a resistance indicator 660 which provides a resistance measurement to the user of heating system 685. Thermostat 600 may further identify a resistance between wire connector 625 and ground at indicator 665 and a resistance between wire connector 630 and ground at indicator 670. Indicator 665 and 670 may illustrate a pass/fail condition (or "open lead/loop" identified by O.L., representing there is no connection) as a result of the test. As shown in FIG. 6, it is assumed that wire connector 625 may be connected to a hot wire (a positive voltage wire) which is conventionally a black colored wire. It is further assumed that wire connector 630 may be connected to a neutral wire (a current return wire) which is conventionally a white colored wire. Thus, indicator 665 and indicator 670 illustrate that the resistance/voltage/current flow between the black wire and the ground wire and between the white wire and the ground wire are within appropriate levels. If indicator 665 or indicator 670 indicates a fail condition, a short circuit exists within heating system 685. In some embodiments, a user may benefit from knowing where the short circuit or an open circuit condition exists (e.g., the black wire or the white wire in connection with the ground wire is the cause of the short circuit, when there is no connection this is the cause of an open circuit) and make repairs accordingly. A short circuit condition exists when two wires which should not be in electrical contact are in electrical contact. An open circuit condition exists when two wires which should be in electrical contact are not in electrical contact. For reference, the resistance of a short circuit is typically 0 ohms or an minimal resistance while a resistance of an open circuit is typically infinity.

In practice and for example, heating system 685 may create heat using electricity and be installed within a tile floor to warm the tiles to be more comfortable for interaction with bare human feet, for example. Thermostat 600 may be used to test heating system 685 by checking the resistance, voltage, and/or current of heating system 685 using the techniques described above to determine if and where a short circuit or open circuit exists that would prevent heating system 685 from warming as intended. Thermostat 685 may further receive temperature information from sensor 680 which is disposed in the floor to determine whether or not the heating system 685 is responding to instructions to increase the heat level of the floor within which heating system 685 is installed. Sensor 680 may be a temperature sensor which provides temperature information about the floor to thermostat 600. Thermostat 600 may in addition to using test button 655, automatically determine that a short circuit or open circuit condition exists within heating system 685 and automatically provide short circuit or open circuit failure information in indicator 665 or indicator 670. For example, if thermostat 600 detects that the temperature of the floor, based on temperature data from sensor 680, has not increased within a certain amount of time (e.g., 10 minutes) thermostat 600 may automatically test heating system 685 to determine whether or not a short circuit or an open circuit condition exists. Once detected, thermostat 600 may provide a failure message through indicators 665 and/or 670.

As shown in FIG. 6, thermostat 600 may provide various modes of operation. As illustrated, button 675A has been interacted with by a user which causes thermostat 600 to enter an “install” mode, which provides for manual testing of a circuit of heating system 685. Thermostat 600 may further include an operation mode 675B button which when selected by a user causes thermostat 600 to perform a set heating and cooling routine for either a floor heating system, such as heating system 685 or for a home heating and air conditioning system. Thermostat 600 may further provide sub modes to the operation mode which may allow a user to review temperature information about just an air temperature via button 675C or a floor heating system via button 675D.

Finally, it is noted that thermostat 600 may connect in a wired fashion or wirelessly with other devices. For example, a wireless connection 695 may be established between thermostat 600 and another device, which may include any personal electronic device 690 that has sufficient processing power to interact with thermostat 695. Examples of personal electronic devices include smart phones, smart watches, laptop computers, desktop computers, tablets, electronic reading devices, and other devices known to those of ordinary skill in the art. These devices may connect to thermostat 600 (e.g., by a processor and accompanying circuitry in thermostat 600) via the Internet or any known information exchange protocol or may connect through an application downloaded to the device, and control thermostat 600. All of the functionality provided by thermostat 600 may be available through personal electronic device 690. For example, a user, such as a technician, may remotely access, with permission from an owner of thermostat 600, thermostat 600 to obtain information about the resistance of heating system 685, and view indicator 665 and 670 to determine a cause of a problem before visiting a home to inspect the problem in person.

In another embodiment, thermostat 600 may connect in a wired fashion by a port or a plug to a complimentary port of plug in personal electronic device 690 either directly or by adapters. One non-limiting example may be that one of wire connections 620-635 may include a USB (universal serial bus) type connector, or any other similar connector known in the art, to allow the personal electronic device to exchange information to and from thermostat 600. In one embodiment, personal electronic device 690 when connected in a wired fashion or wirelessly, may allow the user of personal electronic device 690 to interact with thermostat 600 and cause thermostat 600 to perform various operations, such as tests, calibrations, and any other function provided by thermostat 600. Information provided to personal electronic device 690 may be then shared with other devices through personal electronic device 690, as desired.

The foregoing description has been presented for purposes of illustration. It is not exhaustive and does not limit the invention to the precise forms or embodiments disclosed. Modifications and adaptations will be apparent to those skilled in the art from consideration of the specification and practice of the disclosed embodiments. For example, components described herein may be removed and other components added without departing from the scope or spirit of the embodiments disclosed herein or the appended claims.

Other embodiments will be apparent to those skilled in the art from consideration of the specification and practice of the disclosure disclosed herein. It is intended that the specification and examples be considered exemplary only, with a true scope and spirit of the invention being indicated by the following claims.

What is claimed is:

1. A wire testing device comprising:
a body comprising
a display screen disposed in the body comprising:
an operation indicator displayed within the display screen which indicates when the wire testing device is ready to test or testing connectivity of a circuit,
a numerical resistance indicator, and
one or more ground test indicators, the numerical resistance indicator and the one or more ground test indicators being displayed within the screen together, the one or more ground test indicators identifying connectivity between one or more pairs of wires connected to the body;
a speaker disposed in the body:
wire ports connecting the one or more pairs of wires to the body, the wire ports having corresponding connection release buttons; and
a temperature sensor, connecting to the body, through which the wire testing device monitors heating of the circuit.

2. The wire testing device of claim 1, wherein the wire ports each include a wire connector.

3. The wire testing device of claim 2, wherein one of the wire ports includes a wire connector for a personal electronic device.

4. The wire testing device of claim 1, wherein the wire testing device connects to another device by a wireless information connection.

5. The wire testing device of claim 1, wherein the display screen is a touch responsive screen.

6. The wire testing device of claim 1, wherein the temperature sensor is an ambient temperature sensor.

7. The wire testing device of claim 1, further comprising a test button.

8. The wire testing device of claim 7, wherein the test button causes the wire testing device to test electrical resistance in the circuit.

9. The wire testing device of claim 7, wherein the test button causes the wire testing device to test an electrical resistance and causes the wire testing device to identify a pass or fail condition in response to the electrical resistance detected during the test of the electrical resistance.

10. The wire testing device of claim 1, wherein the wire testing device further detects, by the temperature sensor, a temperature of ambient air and a temperature of an in-floor heating system.

11. A thermostat device, comprising a body comprising a display screen disposed to the body comprising:

an operation indicator displayed within the display screen which indicates when the thermostat device is ready to test or testing connectivity of a circuit, a numerical resistance indicator, and one or more ground test indicators, the numerical resistance indicator and the one or more ground test indicators being displayed within the screen together and the one or more ground test indicators identifying connectivity between one or more pairs of wires connected to the body; and wire connectors connecting the one or more pairs of wires to the body, the wire ports having corresponding connection release buttons; and a temperature sensor, connecting to the body, through which the thermostat device monitors heating of the circuit.

12. The thermostat device of claim 11, wherein the wire connectors include a wire connector for a personal electronic device.

13. The thermostat device of claim 11, wherein the thermostat device connects to another device by a wireless information connection.

14. The thermostat device of claim 11, wherein the display screen is a touch responsive screen.

15. The thermostat device of claim 11, wherein the temperature sensor is an ambient temperature sensor.

16. The thermostat device of claim 11, further comprising a test button.

17. The thermostat device of claim 16, wherein the test button causes the thermostat device to test electrical resistance in the circuit.

18. The thermostat device of claim 16, wherein the test button causes the thermostat device to test an electrical resistance and causes the thermostat device to identify a pass or fail condition in response to the electrical resistance detected during the test of the electrical resistance.

19. The thermostat device of claim 11, wherein the thermostat device further detects, by the temperature sensor, a temperature of ambient air and a temperature of an in-floor heating system.

20. The thermostat device of claim 11, further comprising an internet connection which provides remote access to the thermostat device.

* * * * *